United States Patent
Shimoda et al.

(10) Patent No.: US 10,602,613 B2
(45) Date of Patent: Mar. 24, 2020

(54) ELECTRONIC DEVICE (71) Applicant: OMRON Corporation, Kyoto (JP)

(72) Inventors: Seiki Shimoda, Kumamoto (JP); Masaaki Abe, Kumamoto (JP)

(73) Assignee: Omron Corporation, Kyoto (JP)

( * ) Notice: Subject to any disclaimer, the term of this patent is extended or adjusted under 35 U.S.C. 154(b) by 127 days.

(21) Appl. No.: 15/560,264

(22) PCT Filed: Mar. 8, 2016

(86) PCT No.: PCT/JP2016/057148
§ 371 (c)(1),
(2) Date: Sep. 21, 2017

(87) PCT Pub. No.: WO2016/167049
PCT Pub. Date: Oct. 20, 2016

(65) Prior Publication Data
US 2018/0070449 A1 Mar. 8, 2018

(30) Foreign Application Priority Data
Apr. 13, 2015 (JP) .................................. 2015-081729

(51) Int. Cl.
H01H 9/02 (2006.01)
H05K 1/18 (2006.01)
(Continued)

(52) U.S. Cl.
CPC .......... *H05K 1/181* (2013.01); *H01H 50/023* (2013.01); *H01H 50/14* (2013.01); *H01H 50/043* (2013.01);
(Continued)

(58) Field of Classification Search
CPC ...... H01H 50/02; H01H 50/14; H01H 50/047; H01H 50/023; H05K 1/18; H05K 1/181
(Continued)

(56) References Cited

U.S. PATENT DOCUMENTS 5,195,155 A * 3/1993 Shimaoka ............ G02B 6/4208
385/33
5,289,144 A * 2/1994 Liao ..................... H01H 50/041
335/78
(Continued)

FOREIGN PATENT DOCUMENTS

CN 204155848 U 2/2015
JP H08-255544 A 10/1996
(Continued)

OTHER PUBLICATIONS

Office Action issued in Chinese Application No. 201680017166.1, dated Sep. 14 2018 (12 pages).
(Continued)

*Primary Examiner* — Shawki S Ismail
*Assistant Examiner* — Lisa N Homza
(74) *Attorney, Agent, or Firm* — Osha Liang LLP (57) ABSTRACT

An electronic device where molten solder does not come into contact with a sealant so as not to destroy a sealing function. An electronic device is provided with: an insulating base mounted on a printed circuit board; a common planar terminal provided so as to extend from an outer side surface to a bottom surface edge of the insulating base, and cause electrical continuity between the outer side surface and the bottom surface edge of the insulating base; a cover fitted to the insulating base and covering the common planar terminal; and a sealant sealing a gap between the outer side surface of the insulating base and an inner circumferential surface of the cover. A solder pool is formed in a position surrounded by the printed circuit board and the common planar terminal at the bottom surface edge of the insulating base.

7 Claims, 11 Drawing Sheets (51) Int. Cl.
*H01H 50/02* (2006.01)
*H01H 50/14* (2006.01)
*H01H 50/04* (2006.01)
*H01H 1/58* (2006.01)
*H01H 51/22* (2006.01)

(52) U.S. Cl.
CPC ......... *H01H 50/047* (2013.01); *H01H 51/229* (2013.01); *H01H 2001/5888* (2013.01); *H05K 2201/10053* (2013.01); *H05K 2201/1078* (2013.01); *H05K 2201/10803* (2013.01); *H05K 2201/10931* (2013.01)

(58) Field of Classification Search
USPC .......................................................... 335/202
See application file for complete search history.

(56) References Cited

U.S. PATENT DOCUMENTS

| | | | |
|---|---|---|---|
| 5,673,011 A | 9/1997 | Okihara et al. | |
| 6,781,490 B2* | 8/2004 | Funayama | H01H 50/026 335/78 |
| 2016/0086754 A1* | 3/2016 | Shimoda | H01H 50/28 335/2 |
| 2018/0070449 A1* | 3/2018 | Shimoda | H01H 50/023 |
| 2018/0075993 A1* | 3/2018 | Shimoda | H01H 50/02 |
| 2018/0144892 A1* | 5/2018 | Shimoda | H01F 27/02 |

FOREIGN PATENT DOCUMENTS

| | | |
|---|---|---|
| JP | 2002-076161 A | 3/2002 |
| JP | 2004-158349 A | 6/2004 |
| JP | 2014-179947 A | 9/2014 |

OTHER PUBLICATIONS

International Search Report issued in PCT/JP2016/057148 dated Jun. 7, 2016 (2 pages).
Written Opinion of the International Searching Authority issued in PCT/JP2016/057148 dated Jun. 7, 2016 (4 pages).

* cited by examiner

ELECTRONIC DEVICE

TECHNICAL FIELD

The present invention generally relates to an electronic device, and especially to an electronic device that is mounted on a surface of a printed circuit board via solder.

BACKGROUND

Conventionally, as an electronic device that is mounted on the surface of a printed circuit board, there is, for example, a surface mount type leadless electromagnetic relay provided with: a coil assembly including an iron core, a coil spool containing the iron core with a part thereof exposed, and a coil wound around the coil spool; an armature assembly including an armature with one end thereof in contact with at least one end of the iron core, a movable contact spring having at least one movable contact at an tip thereof, and a support made up of an insulator that supports the armature and the movable contact spring; and at least one fixed contact that faces the movable contact, and a fixed contact terminal that holds the fixed contact. In the electromagnetic relay including a cover and an insulating substrate that houses the coil assembly inside, the movable contact, the movable contact spring, the fixed contact, and a terminal, which is electrically connected to an external electric circuit from the coil, is formed integrally with the insulating substrate, the terminal adhering to the bottom of the relay body and being extended thereon (See Patent Document 1).

As illustrated in FIG. 5C of Patent Document 1, the above surface mount type leadless electromagnetic relay is sealed by putting a cover 51 over an insulating substrate 3005 and filling a gap therebetween with a sealant 45. Then, the surface mount type leadless electromagnetic relay is electrically connected to the printed circuit board via solder.

PRIOR ART DOCUMENT

Patent Document

Patent Document 1: Japanese Unexamined Patent Publication No. H8-255544

SUMMARY

In the electrical connection, molten solder may get into the gap between the outer side surface of the insulating substrate 3005 and the inner circumferential surface of the cover 51 due to a capillary phenomenon, and comes into contact with the sealant 45 to destroy the sealing function.

One or more embodiments of the present invention to provide an electronic device where molten solder does not come into contact with a sealant so as not to destroy a sealing function.

One or more embodiments of an electronic device according to the present invention is provided with: an insulating base mounted on a mounted portion; a planar terminal provided so as to extend from an outer side surface to a bottom surface edge of the insulating base, and configured to cause electrical continuity between the outer side surface and the bottom surface edge of the insulating base; a cover fitted to the insulating base and covering the planar terminal; and a sealant configured to seal a gap between the outer side surface of the insulating base and an inner circumferential surface of the cover. A solder pool is formed in a position surrounded by the mounted portion and the planar terminal at the bottom surface edge of the insulating base.

Note that the bottom surface means the mounted-portion-contacting-side surface of the insulating base, and the outer side surface means an outer circumferential surface except for the bottom surface of the insulating base and the upper surface facing the bottom surface.

According to one or more embodiments of the present invention, a molten solder is collected in the solder pool, and does not get into a gap between the outer side surface of the insulating base and the inner circumferential surface of the cover. It is thus possible to obtain an electronic device where the molten solder does not destroy the sealing function of the sealant.

As one or more embodiments of the present invention, the solder pool may have a ceiling surface that faces the mounted portion.

According to one or more embodiments, the ceiling surface can more reliably inhibit the rise of the molten solder, to still more reliably protect the sealing function of the sealant.

In one or more embodiments of the present invention, the ceiling surface may be a tapered surface that becomes wider outward.

According to one or more embodiments, the tapered surface can more reliably inhibit the rise of the molten solder while preventing formation of an air pool, to still more reliably protect the sealing function of the sealant.

In one or more embodiments of the present invention, after molding of the insulating base with a molding material containing metal and irradiation of a groove provided in the insulating base with a laser beam to deposit metal on the surface of the groove, a metal plated layer may be formed in the groove to form the planar terminal.

According to one or more embodiments, even when the molten solder is collected in the solder pool, it is possible to obtain an electronic device that ensures electrical continuity from the mounted portion to the outer side surface.

In one or more embodiments of the present invention, the planar terminal may cause electrical continuity between the outer side surface of the insulating base and a bottom surface edge of a projection projecting laterally from a lower end of the outer side surface of the insulating base, and a solder pool may be provided at the bottom surface edge of the projection.

Note that the lower end of the outer side surface means an end of the outer circumferential surface of the insulating base, the end being in contact with the bottom surface of the insulating base. Laterally means a direction of separating from the outer circumferential surface along the mounted portion.

According to one or more embodiments, the solder pool provided in the projection inhibits the rise of the molten solder due to a capillary phenomenon, to protect the sealing function of the sealant.

Further, it is possible to visually confirm the exposed surface of the projection, and thereby easily confirming the connecting state of solder and making a poor connection hardly occur.

DETAILED DESCRIPTION

Embodiments of an electronic device according to the present invention will be described with reference to the accompanied drawings of FIGS. 1 to 19.

As illustrated in FIGS. 1 to 7, one or more embodiments are the case of application to an electromagnetic relay, which is made up of an insulating base 10, a movable touch piece block 30, and a cover 40.

Figure 1:
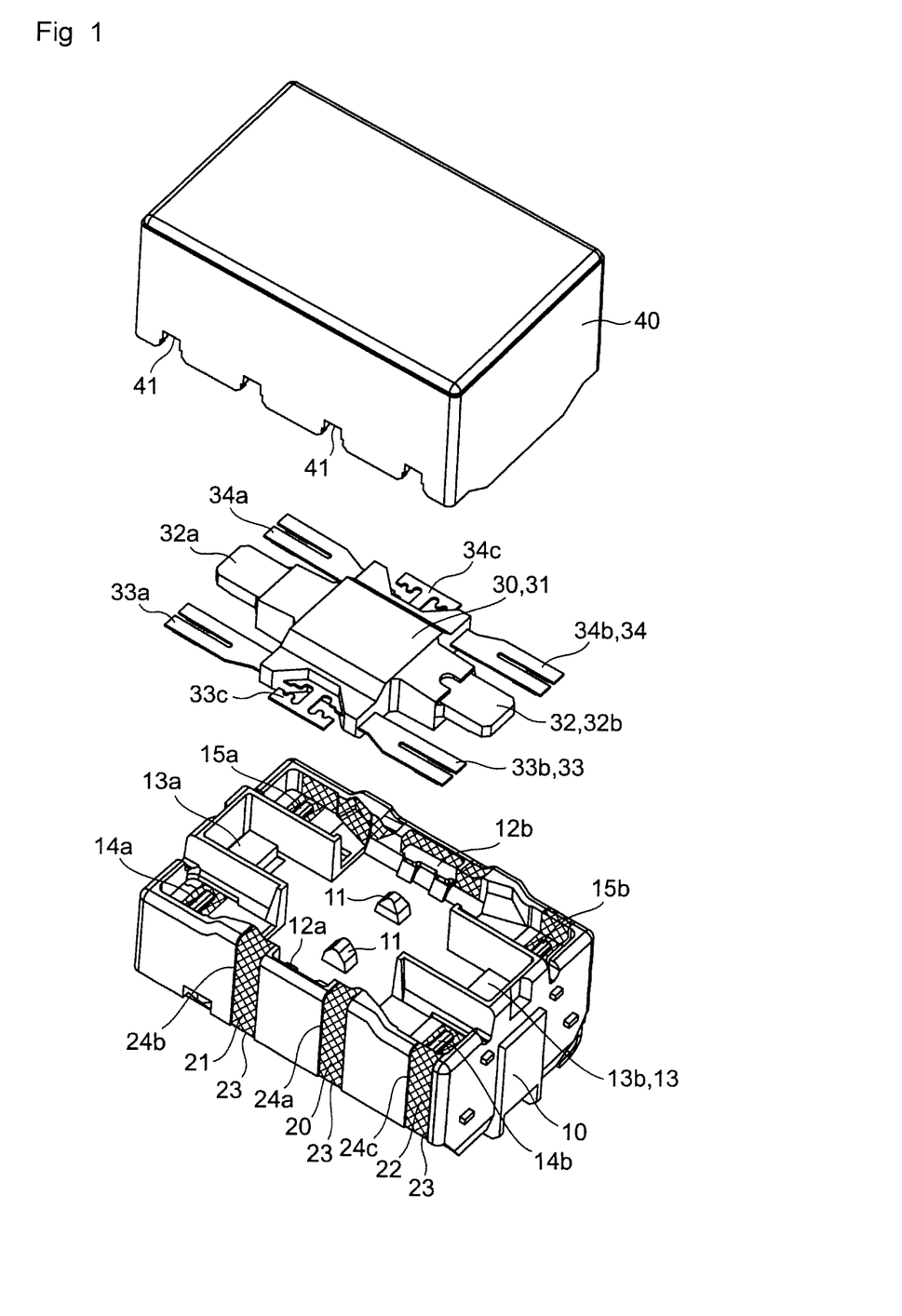
FIG. 1 is an exploded perspective view in the case of applying one or more embodiments of a terminal structure of an electronic device according to the present invention to an electromagnetic relay.

As illustrated in FIG. 1, the insulating base 10 is formed by insert-molding an iron core 13 having a U-shape in a cross section and around which a coil is wound (not illustrated), and a material for the molding contains a base polymer, a filler, and a metal powder. Examples of the base polymer include a liquid crystal polymer (LCP) and polybutylene terephthalate (PBT). A pair of support protrusions 11, 11 are provided in a protruding manner in the center of the bottom surface of the insulating base 10. Common electrodes 12a, 12b are disposed on both sides of the support protrusions 11, 11. Magnetic pole portions 13a, 13b of the iron core 13 are exposed in mutually facing positions with the support protrusions 11, 11 located therebetween. Normally open fixed contacts 14a, 15a, and normally closed fixed contacts 14b, 15b are respectively disposed at corners of the upper surface of the insulating base 10. A common planar terminal 20, a normally open planar terminal 21, and a normally closed planar terminal 22 are provided in parallel on both sides of the outer side surface of the insulating base 10, so as to extend to the bottom surface edge of the insulating base 10. Solder pools 23 (FIG. 5) are respectively formed in positions surrounded by the lower ends of the common planar terminal 20, the normally open planar terminal 21, and the normally closed planar terminal 22, and a printed circuit board 51 described later.

The common planar terminal 20, the normally open planar terminal 21, and the normally closed planar terminal 22 are formed as follows.

Figure 2:
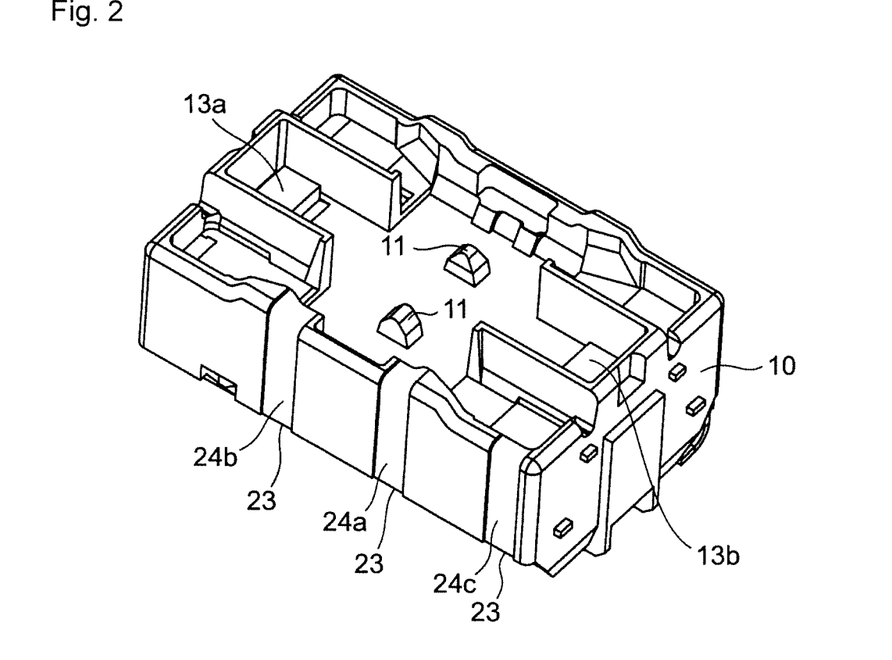
FIG. 2 is a perspective view for describing a manufacturing method for an insulating base illustrated in FIG. 1.
Figure 3:
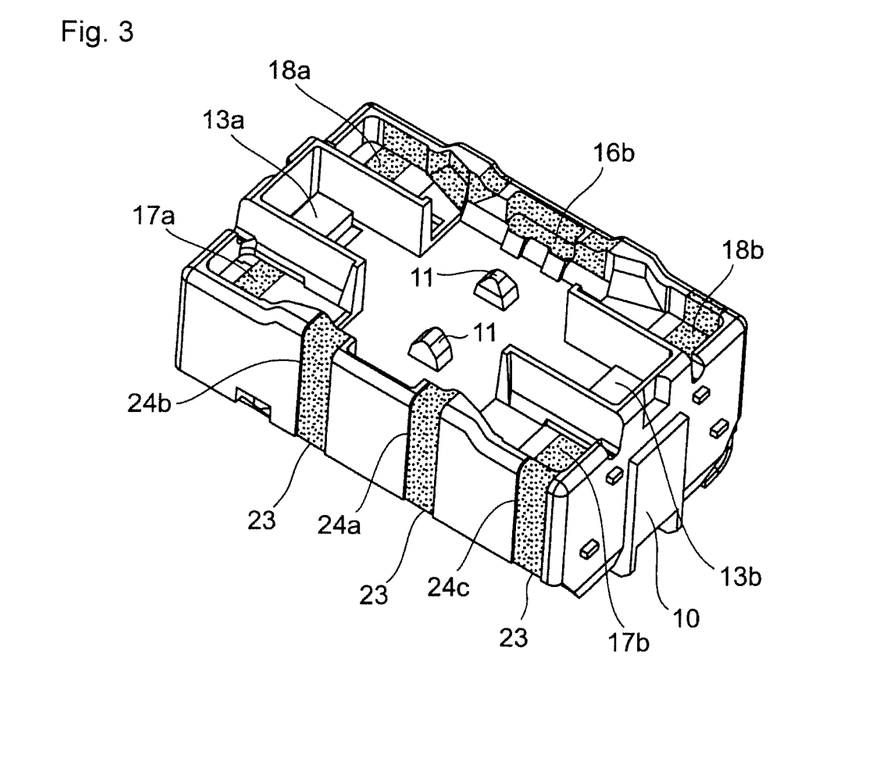
FIG. 3 is a perspective view for describing the manufacturing method for the insulating base, subsequent to FIG. 2.
Figure 4:
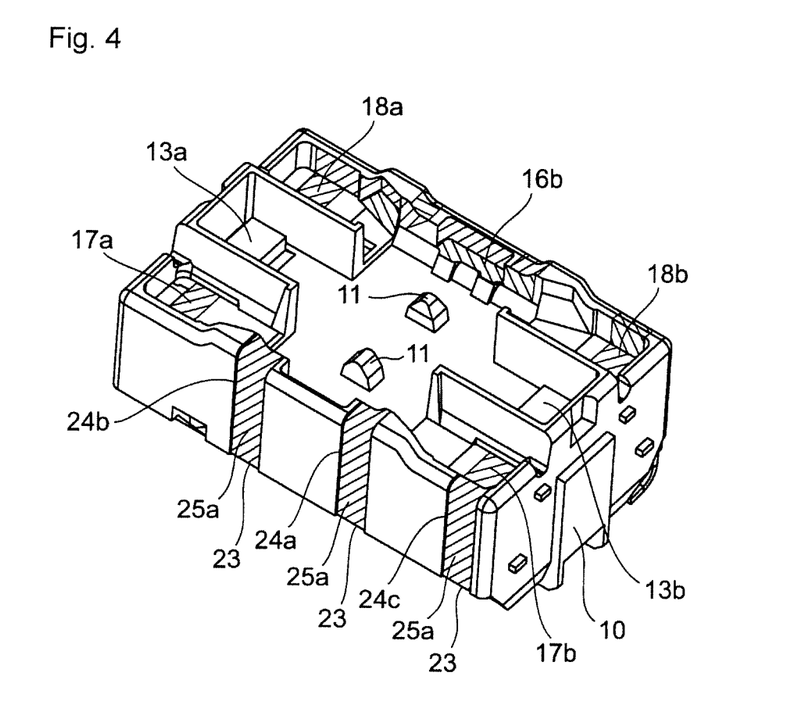
FIG. 4 is a perspective view for describing the manufacturing method for the insulating base, subsequent to FIG. 3.
Figure 5:
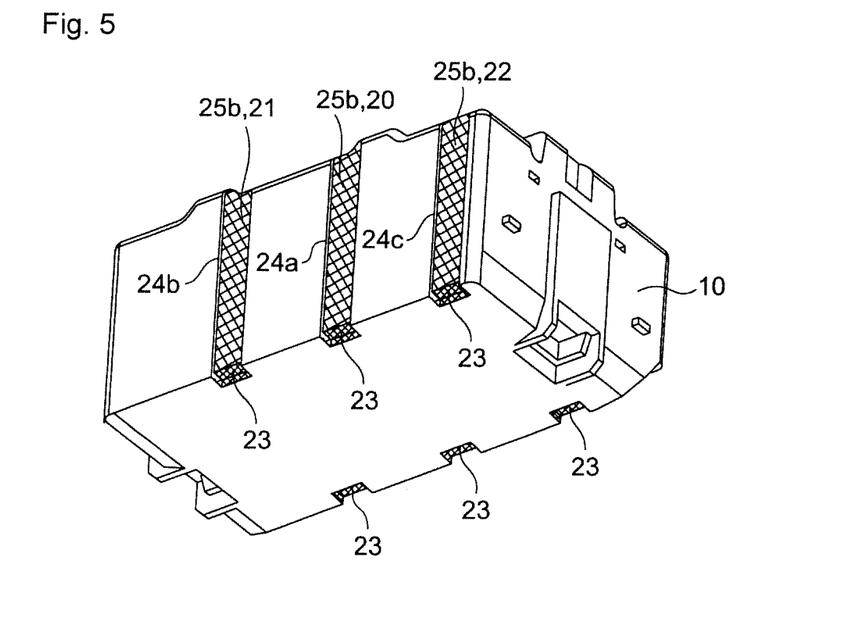
FIG. 5 is a perspective view for describing the manufacturing method for the insulating base, subsequent to FIG. 4, seen from a different angle.

First, the iron core 13 is insert-molded with the foregoing molding material containing a metal powder, to obtain the insulating base 10 provided with three grooves 24a, 24b, 24c on each side of the outer side surface (FIG. 2). Then, as illustrated in FIG. 3, each of the grooves 24a, 24b, 24c is irradiated with a laser light and etched to deposit a metal powder on the surface of each of the grooves 24a, 24b, 24c. Simultaneously with this, each of a set-up region 16b (16a is not illustrated), set-up regions 17a, 18a, and set-up regions 17b, 18b for setting up the common electrodes 12a, 12b, the normally open fixed contacts 14a, 15a, and the normally closed fixed contacts 14b, 15b is continuously irradiated with a laser light and etched, to dispose a metal powder on the surface of the insulating base 10. After coating of the magnetic pole portions 13a, 13b of the iron core 13 with a coating material (not illustrated), the insulating base 10 is soaked into a plating tank, not illustrated. Thereby, as illustrated in FIGS. 4 and 5, a copper-plated layer 25a and/or a nickel-plated layer 25b are sequentially laminated on the surface with the metal powder deposited, to form the common planar terminal 20, the normally open planar terminal 21, and the normally closed planar terminal 22.

By the above process, the common planar terminal 20, the normally open planar terminal 21, and the normally closed planar terminal 22 can cause electrical continuity from the bottom surface edge to the outer side surface of the insulating base 10. Further, the common planar terminal 20, the normally open planar terminal 21, and the normally closed planar terminal 22 can continuously cause electrical continuity to the set-up region 16b (16a is not illustrated), the set-up regions 17a, 18a, and the set-up regions 17b, 18b for setting up the common electrodes 12a, 12b, the normally open fixed contacts 14a, 15a, and the normally closed fixed contacts 14b, 15b.

Figure 6:
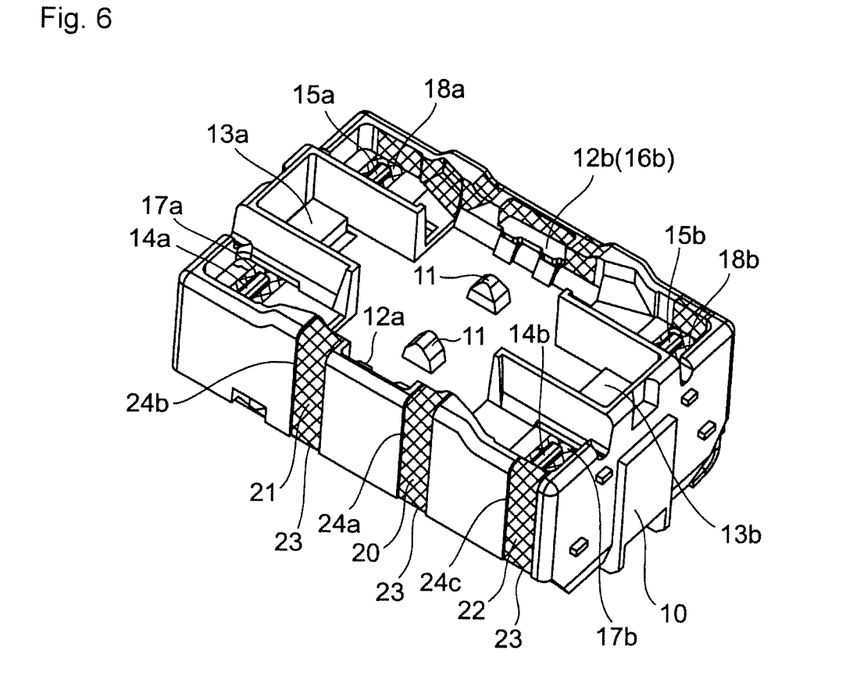
FIG. 6 is a perspective view for describing the manufacturing method for the insulating base, subsequent to FIG. 5.

The coating material provided on the magnetic pole portions 13a, 13b are then removed. Moreover, the common electrodes 12a, 12b, the normally open fixed contacts 14a, 15a, and the normally closed fixed contacts 14b, 15b are respectively welded and integrated to the set-up regions 16a, 16b (16a is not illustrated), the set-up regions 17a, 18a, and the set-up regions 17b, 18b, to complete the insulating base 10 (FIG. 6).

Note that the foregoing metal powder is not necessarily restricted to a powdery body, but can be replaced by any row material so long as it allows deposition of metal on the surface of the insulating base 10 by laser irradiation.

As illustrated in FIG. 1, the movable touch piece block 30 is formed by integrally molding, onto a block body 31, a tabular movable iron piece 32 and movable touch pieces 33, 34 disposed parallel to each other on both sides of the tabular movable iron piece 32. Hinge portions 33c, 34c protrude laterally from mutually facing side surfaces of the block body 31, the hinge portions 33c, 34c having a substantially T-shape and extending from the movable touch pieces 33, 34.

The cover 40 has a box shape fittable to the insulating base 10 assembled with the movable touch piece block 30. Notches 41 are provided at mutually facing edges of an opening of the cover 40. Each of the notches 41 is provided for the purpose of confirming the connecting state of solder 52 described later, and preventing a sealant 50 described later from adhering to the inner surface of the solder pool 23 when the sealant 50 moves along the inner circumferential surface of the cover 40.

Then, the movable touch piece block 30 is mounted and positioned on the support protrusions 11, 11 of the insulating base 10. Subsequently, the hinge portions 33c, 34c of the movable touch piece block 30 are welded and integrated to the common electrodes 12a, 12b, to rotatably support the movable touch piece block 30. Hence both ends 32a, 32b of the tabular movable iron piece 32 contactably and separably face the magnetic pole portions 13a, 13b of the iron core 13. Further, both ends 33a, 33b of the movable touch piece 33 contactably and separably face the normally open and normally closed fixed contacts 14a, 14b. Both ends 34a, 34b of the movable touch piece 34 contactably and separably face the normally open and normally closed fixed contacts 15a, 15b.

After fitting of the cover 40 onto the insulating base 10, a gap between the outer side surface of the insulating base 10 and the inner circumferential surface of the cover 40 is filled with the sealant 50 for sealing.

Figure 7:
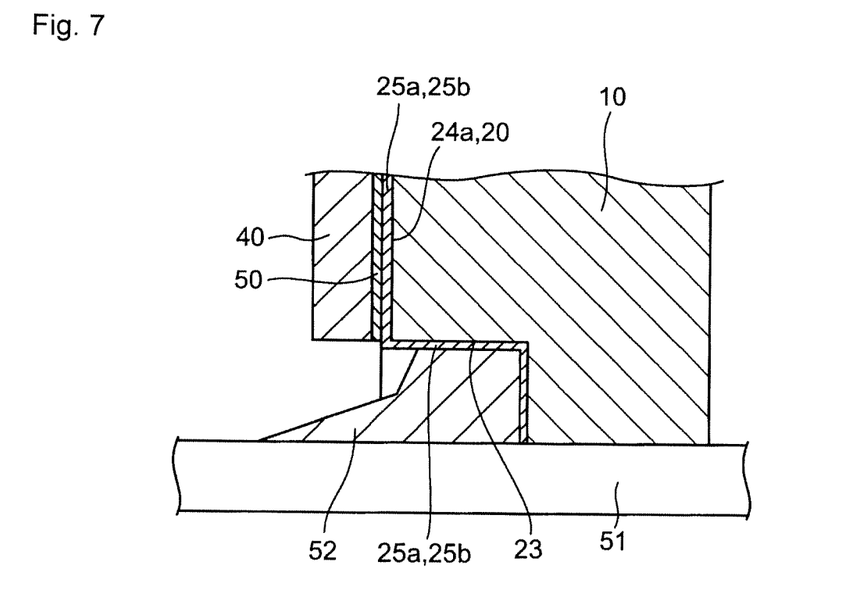
FIG. 7 is a partially enlarged sectional view illustrating the state of putting a cover over the insulating base of FIG. 6.

After positioning of the insulating base 10 of the electromagnetic relay in a predetermined position on the printed circuit board 51 applied with so-called solder paste, the printed circuit board 51 is put into a heating furnace to melt the solder paste. This leads to electrical connection of each of the common planar terminal 20, the normally open planar terminal 21, and the normally closed planar terminal 22 to the printed circuit board 51 via the solder 52 (FIG. 7).

According to one or more embodiments, the molten solder 52 is collected in the solder pool 23 and does not rise due to a capillary phenomenon. Hence the molten solder 52 does not come into contact with the sealant 50 filled the gap between the insulating base 10 and the cover 40, and the sealing function is thus not lost.

Especially, the solder pool 23 has a ceiling surface that faces the printed circuit board 51. For this reason, the ceiling surface can inhibit the rise of the molten solder 52, thus enabling reliable protection of the sealing function.

Note that the foregoing effect is not restricted to the solder paste, but a so-called solder ball produces a similar effect.

Figure 8:
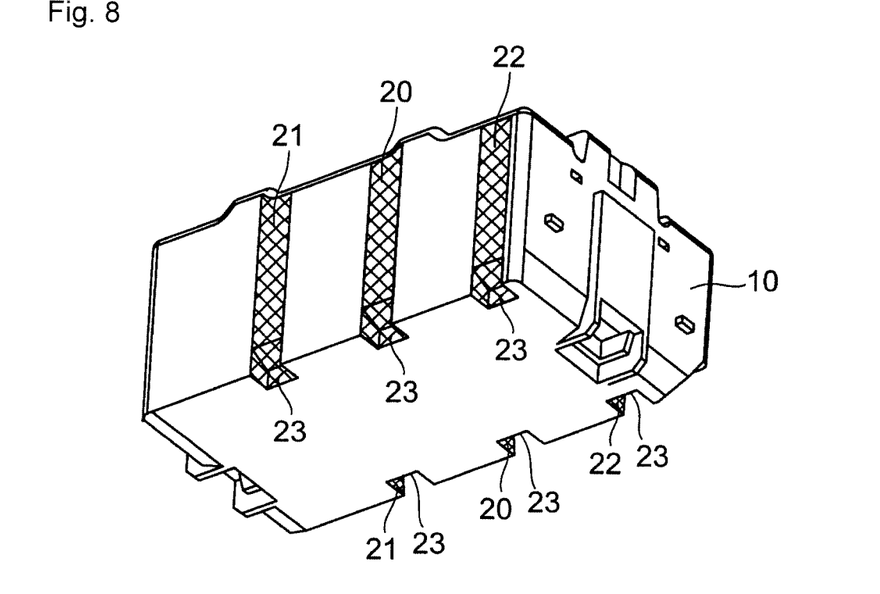
FIG. 8 is a perspective view illustrating an insulating base of one or more embodiments, to which a terminal structure of the electronic device according to the present invention is applied.
Figure 9:
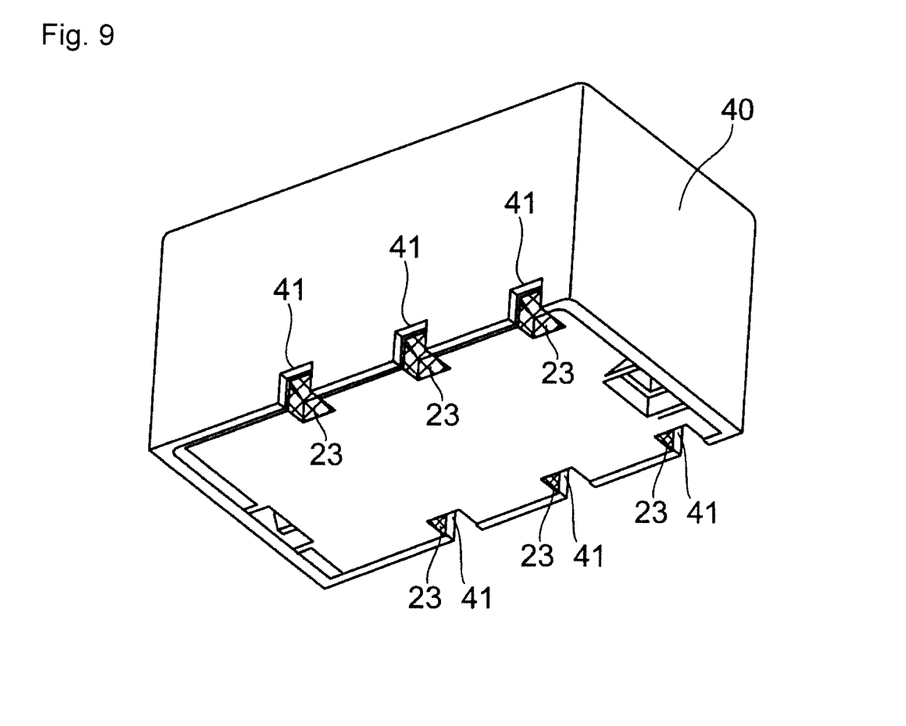
FIG. 9 is a perspective view illustrating the state of putting a cover over the insulating base illustrated in FIG. 8.
Figure 10:
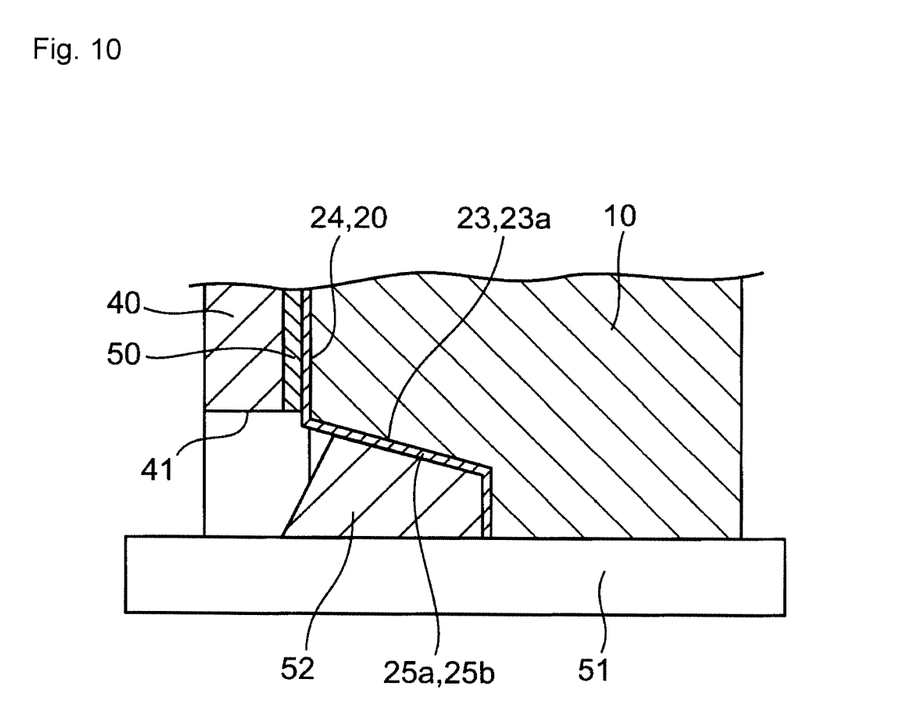
FIG. 10 is a partially enlarged sectional view of an electromagnetic relay illustrated in FIG. 9.
Figure 11:
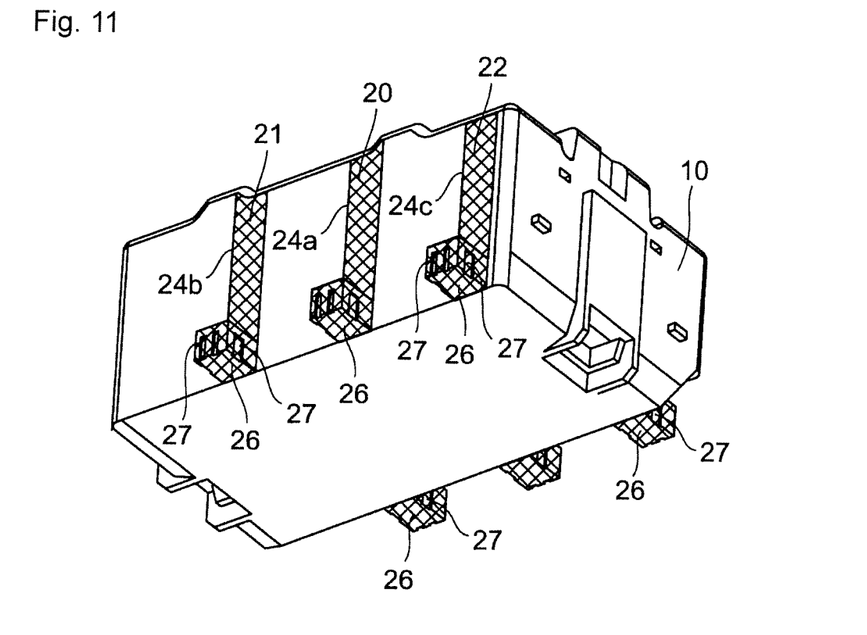
FIG. 11 is a perspective view illustrating an insulating base of one or more embodiments, to which a terminal structure of the electronic device according to the present invention is applied.
Figure 12:
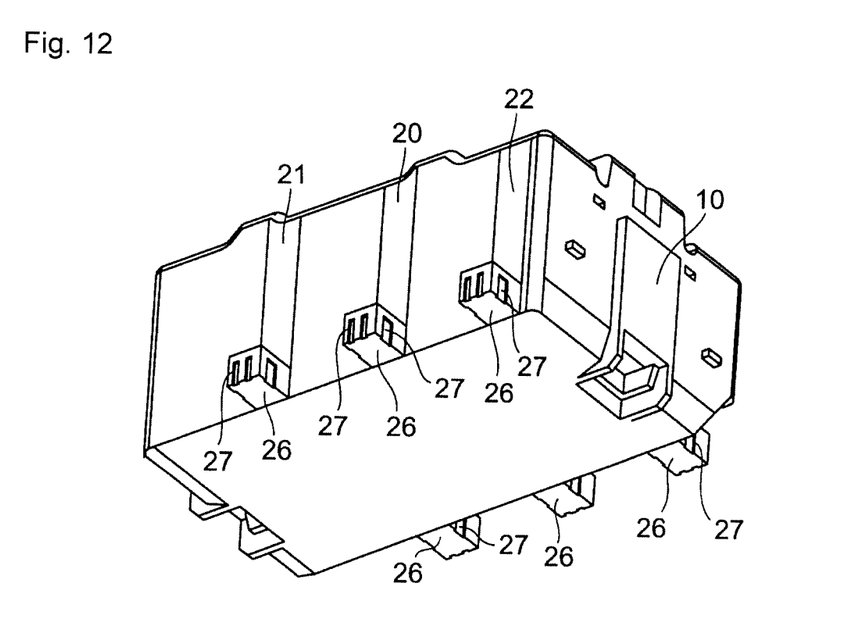
FIG. 12 is a perspective view of the insulating base illustrated in FIG. 11 before being processed.
Figure 13:
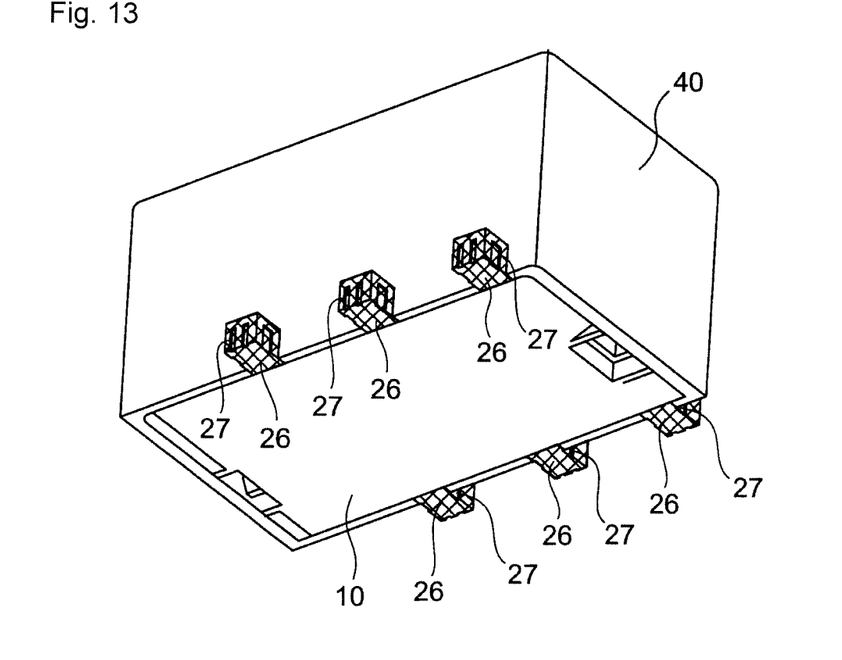
FIG. 13 is a perspective view illustrating the state of putting a cover over the insulating base illustrated in FIG. 11.
Figure 14:
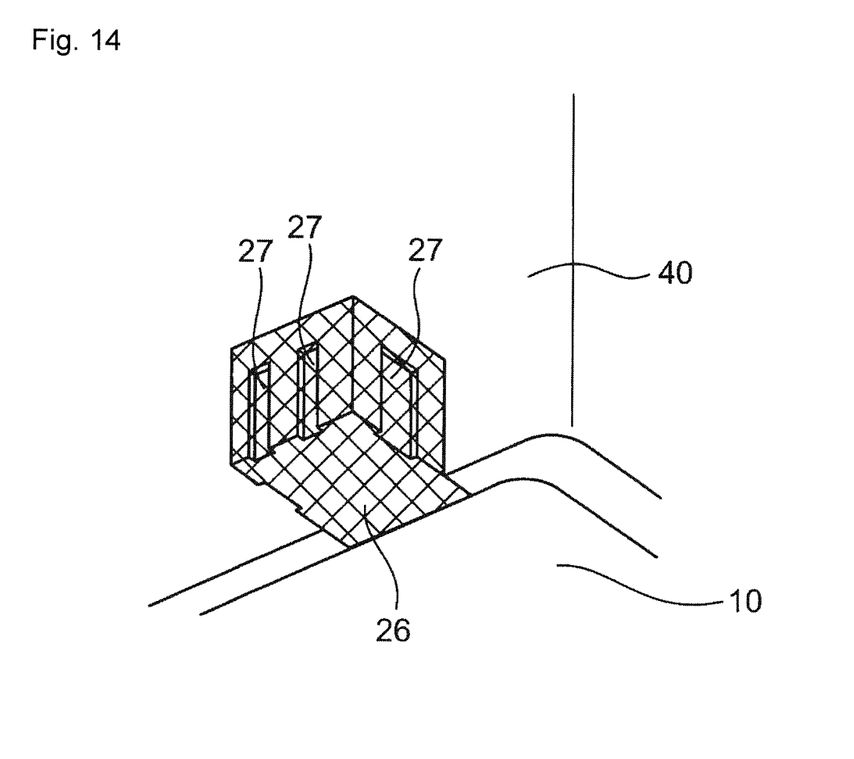
FIG. 14 is a partially enlarged view of FIG. 13.
Figure 15:
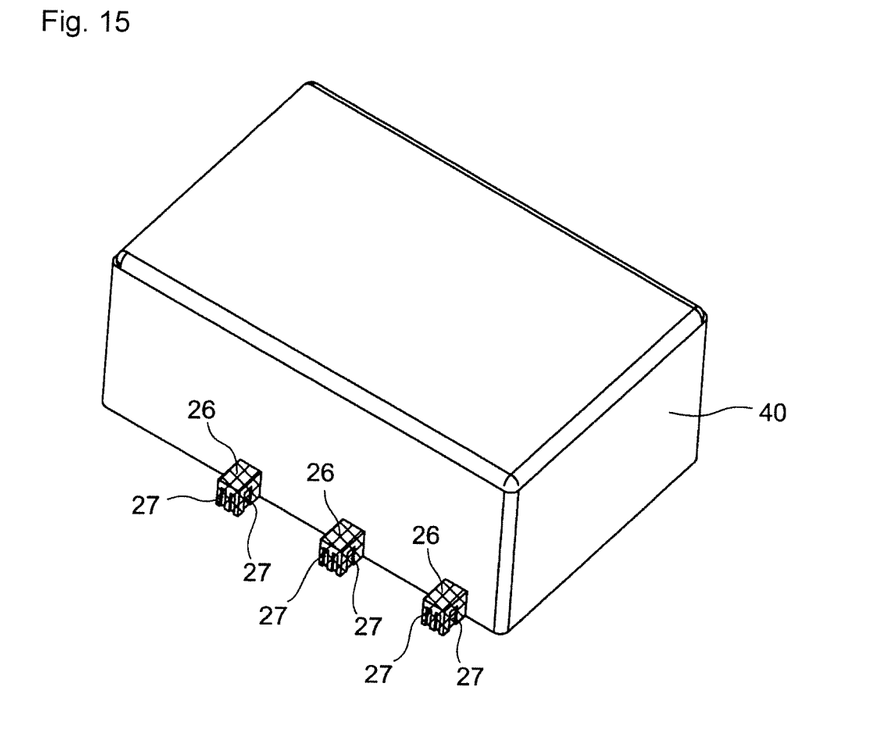
FIG. 15 is a perspective view of the electronic device illustrated in FIG. 13, seen from a different angle.
Figure 16:
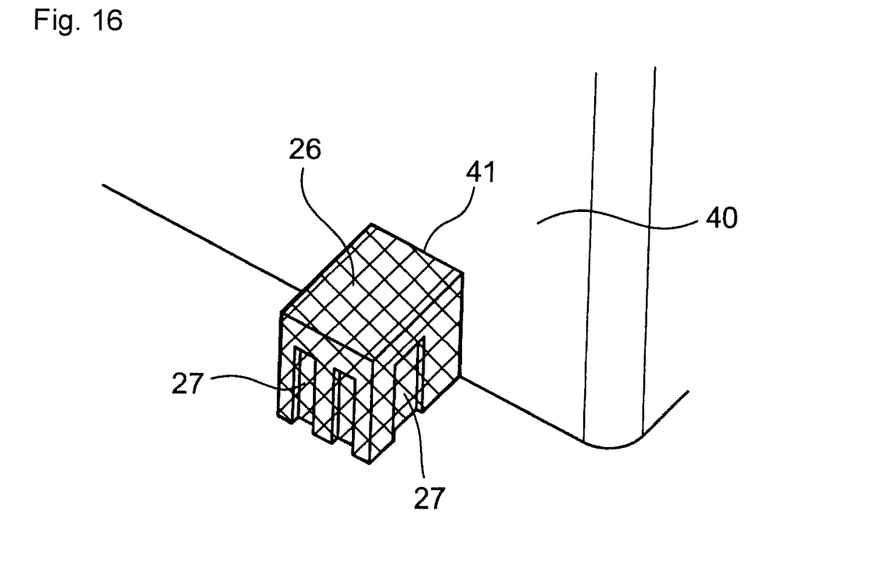
FIG. 16 is a partially enlarged view of the perspective view illustrated in FIG. 15.

One or more embodiments are almost the same as one or more other embodiments as illustrated in FIGS. 8 to 10. One or more embodiments are different in that the ceiling surface of the solder pool 23 is a tapered surface 23a that becomes wider outward (FIG. 10). Since the others are similar to those of one or more embodiments, the same portions are provided with the same numerals, and descriptions thereof are omitted.

According to one or more embodiments, as illustrated in FIG. 10, since the ceiling surface of the solder pool 23 is a tapered surface 23a that becomes wider outward, the molten solder 52 hardly moves along the tapered surface 23a of the solder pool 23, thereby enabling more reliable protection of the sealing function. It is also advantageous that an air in the solder pool 23 easily escapes to make a poor connection hardly occur.

As illustrated in FIGS. 11 to 18, one or more embodiments are the case of providing a projection 26 projecting laterally from the lower end of the outer side surface of the insulating base 10, and forming each of the common planar terminal 20, the normally open planar terminal 21, and the normally closed planar terminal 22 so as to include the projection 26.

That is, each of the common planar terminal 20, the normally open planar terminal 21, and the normally closed planar terminal 22 is provided so as to cause electrical continuity from the outer side surface of the insulating base 10 to the bottom surface edge of the projection 26. Further, a vertical groove 27 being a solder pool is previously formed on the exposed side surface at the bottom surface edge of the projection 26.

In other words, the vertical groove 27 becomes the solder pool, the vertical groove 27 being formed in a region surrounded by the printed circuit board 51 and each of the common planar terminal 20, the normally open planar terminal 21, and the normally closed planar terminal 22 at the bottom surface edge of the insulating base 10.

Since formation of a copper-plated layer and a nickel-plated layer are similar to those in one or more embodiments, the same portions are provided with the same numerals, and descriptions thereof are omitted.

According to one or more embodiments, the vertical groove 27 increases a contact area with the solder and can prevent the rise of the molten solder.

Figure 19:
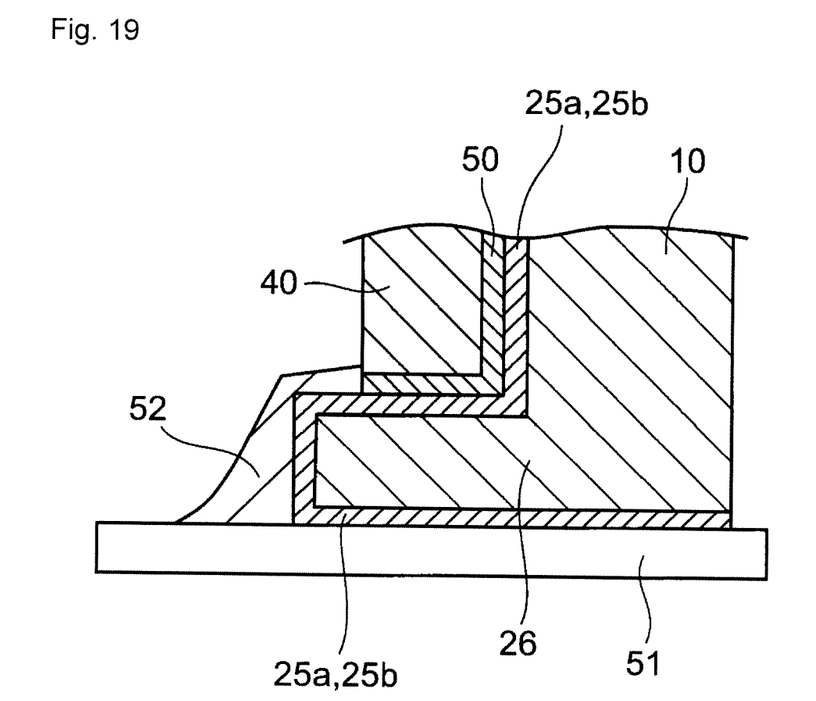
FIG. 19 is a partially enlarged sectional view illustrating a surface-mount state of a terminal structure of an electronic device according to a comparative example.

That is, as in a comparative example illustrated in FIG. 19, when a vertical groove is not provided in the projection 26, the molten solder 52 runs on the upper surface of the projection 26 and comes into contact with the sealant 50 filled the gap between the insulating base 10 and the cover 40, to destroy the sealing function.

Figure 17:
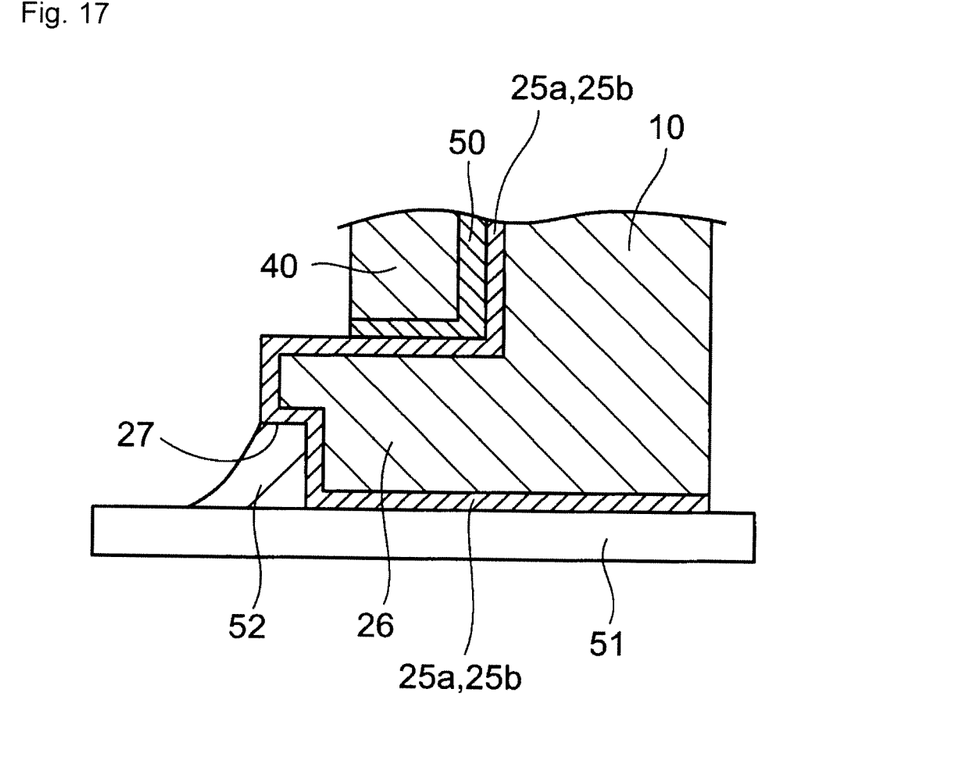
FIG. 17 is a partially enlarged sectional view illustrating a surface-mount state of the electronic device illustrated in FIG. 15.

However, according to one or more embodiments illustrated in FIG. 17, it is advantageous that the vertical groove 27 provided in the projection 26 inhibits running of the molten solder 52 on the upper surface of the projection 26, to protect the sealing function of the sealant 50.

Figure 18:
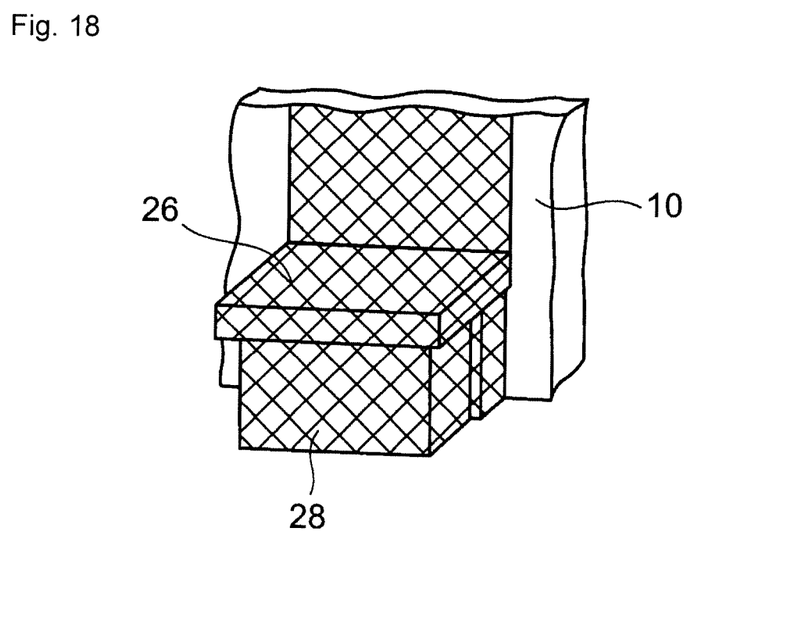
FIG. 18 is a partial perspective view illustrating one or more embodiments where a terminal structure of the electronic device according to the present invention is applied.

As illustrated in FIG. 18, one or more embodiments are almost the same as one or more other embodiments. One or more embodiments are different in that a notch 28 having a U-shape in a cross section is provided on three side surfaces extended to the bottom surface edge of the projection 26 projecting from the insulating base 10.

According to one or more embodiments, it may be advantageous to be able to still more reliably prevent the rise of the molten solder.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

INDUSTRIAL APPLICABILITY

It is natural that the invention is not restricted to the electromagnetic relay, but may also be applied to other electronic devices such as a sensor, a switch, and a connector.

Further, the insulating base and the like of the electronic device may be formed not only by performing resin molding with a mold, but by using a 3D printer.

DESCRIPTION OF SYMBOLS 10 insulating base
20 common planar terminal
21 normally open planar terminal
22 normally closed planar terminal
23 solder pool
23a tapered surface
24a, 24b, 24c groove
25a copper-plated layer
25b nickel-plated layer
26 projection
27 vertical groove (solder pool)
28 notch (solder pool)
40 cover
41 notch
50 sealant
51 printed circuit board (mounted portion)
52 solder

The invention claimed is:

1. An electronic device comprising:
an insulating base mounted on a mounted portion;
a planar terminal provided so as to extend from an outer side surface to a bottom surface edge of the insulating base, and cause electrical continuity between the outer side surface and the bottom surface edge of the insulating base;
a cover fitted to the insulating base and covering the planar terminal; and
a sealant sealing a gap between the outer side surface of the insulating base and an inner circumferential surface of the cover,
wherein a solder pool is formed in a position surrounded by the mounted portion and the planar terminal at the bottom surface edge of the insulating base.

2. The electronic device according to claim 1, wherein the planar terminal causes electrical continuity between the outer side surface of the insulating base and a bottom surface edge of a projection projecting laterally from a lower end of the outer side surface of the insulating base, and a solder pool is provided at the bottom surface edge of the projection.

3. An electronic device comprising:
an insulating base mounted on a mounted portion;
a planar terminal provided so as to extend from an outer side surface to a bottom surface edge of the insulating base, and cause electrical continuity between the outer side surface and the bottom surface edge of the insulating base;
a cover fitted to the insulating base and covering the planar terminal; and
a sealant sealing a gap between the outer side surface of the insulating base and an inner circumferential surface of the cover,
wherein a solder pool is formed in a position surrounded by the mounted portion and the planar terminal at the bottom surface edge of the insulating base, and
wherein the solder pool has a ceiling surface that faces the mounted portion.

4. The electronic device according to claim 3, wherein the ceiling surface is a tapered surface that becomes wider outward.

5. The electronic device according to claim 4, wherein, after molding of the insulating base with a molding material containing metal and irradiation of a groove provided in the insulating base with a laser beam to deposit metal on a surface of the groove, a metal plated layer is formed in the groove to form the planar terminal.

6. The electronic device according to claim 3, wherein, after molding of the insulating base with a molding material containing metal and irradiation of a groove provided in the insulating base with a laser beam to deposit metal on a surface of the groove, a metal plated layer is formed in the groove to form the planar terminal.

7. An electronic device comprising:
an insulating base mounted on a mounted portion;
a planar terminal provided so as to extend from an outer side surface to a bottom surface edge of the insulating base, and cause electrical continuity between the outer side surface and the bottom surface edge of the insulating base;
a cover fitted to the insulating base and covering the planar terminal; and
a sealant sealing a gap between the outer side surface of the insulating base and an inner circumferential surface of the cover,
wherein a solder pool is formed in a position surrounded by the mounted portion and the planar terminal at the bottom surface edge of the insulating base, and
wherein, after molding of the insulating base with a molding material containing metal and irradiation of a groove provided in the insulating base with a laser beam to deposit metal on a surface of the groove, a metal plated layer is formed in the groove to form the planar terminal.

* * * * *